US010620655B2

(12) United States Patent
Labbe et al.

(10) Patent No.: US 10,620,655 B2
(45) Date of Patent: Apr. 14, 2020

(54) COMPARISON OF A VOLTAGE SIGNAL TO A REFERENCE

(71) Applicant: Arm Limited, Cambridge (GB)

(72) Inventors: Benoit Labbe, Cambridge (GB); Parameshwarappa Anand Kumar Savanth, Cambridge (GB); James Edward Myers, Bottisham (GB)

(73) Assignee: Arm Limited, Cambridge (GB)

( * ) Notice: Subject to any disclaimer, the term of this patent is extended or adjusted under 35 U.S.C. 154(b) by 8 days.

(21) Appl. No.: 16/130,938

(22) Filed: Sep. 13, 2018

(65) Prior Publication Data

US 2020/0089266 A1 Mar. 19, 2020

(51) Int. Cl.
*G05F 3/24* (2006.01)
*G05F 1/46* (2006.01)
*G11C 11/4074* (2006.01)
*G11C 5/14* (2006.01)

(52) U.S. Cl.
CPC .............. *G05F 3/245* (2013.01); *G05F 1/465* (2013.01); *G05F 3/247* (2013.01); *G11C 5/147* (2013.01); *G11C 11/4074* (2013.01)

(58) Field of Classification Search
CPC ..... G05F 3/08; G05F 3/18; G05F 3/22; G05F 3/30; G05F 3/245; G05F 3/247; G05F 3/262; G05F 3/265; G05F 1/56; H03M 1/00; H03M 2201/02; H03M 2201/3115; H03F 3/345; G11C 5/147
USPC .................................................. 323/111–117
See application file for complete search history.

(56) References Cited

U.S. PATENT DOCUMENTS

| | | | |
|---|---|---|---|
| 6,278,326 B1* | 8/2001 | Murray | H03F 3/3066 323/315 |
| 6,970,022 B1 | 11/2005 | Miller | |
| 9,952,617 B1* | 4/2018 | Gupta | G05F 3/262 |
| 2007/0200616 A1* | 8/2007 | Shin | G05F 3/30 327/539 |
| 2009/0108917 A1* | 4/2009 | Chellappa | G05F 3/30 327/539 |
| 2010/0289531 A1 | 11/2010 | Sudjian | |
| 2011/0148389 A1* | 6/2011 | Bohannon | G05F 3/30 323/313 |

(Continued)

OTHER PUBLICATIONS

De Oliveira, et al.; Picowatt, 0.45-0.6 V Self-Biased Subthreshold CMOS Voltage Reference; IEEE Transactions on Circuits and Systems-I: Regular Papers; vol. 64, No. 12; Dec. 2017 DOI: 10.1109/TCSI.2017.2754644.

(Continued)

*Primary Examiner* — Yemane Mehari
(74) *Attorney, Agent, or Firm* — Pramudji Law Group PLLC; Ari Pramudji

(57) ABSTRACT

Briefly, embodiments of claimed subject matter relate to comparison of a signal amplitude, such as a signal originating from a battery, for example, with a reference signal. A reference signal may be generated via body-biasing of one or more transistors, for example, which permit operation of the one or more transistors in a sub-threshold state, in which current through the one or more transistors comprises an exponential relationship to an applied voltage. Thus, at least in particular embodiments, detection of low battery voltage or battery overvoltage may be performed utilizing only a very small amount of electrical power.

18 Claims, 5 Drawing Sheets

(56) References Cited

U.S. PATENT DOCUMENTS

2011/0298463 A1   12/2011   Saito et al.
2013/0021016 A1*  1/2013   Ide ............................ G05F 3/30
                                                              323/314

OTHER PUBLICATIONS

Zhu, et al.; A 0.45 V, Nano-Watt 0.033% Line Sensitivity MOSFET—Only Sub-Threshold Voltage Reference With no Amplifiers; IEEE Transactions on Circuits and Systems-I: Regular Papers; vol. 63, No. 9; Sep. 2016 DOI: 10.1109/TCSI.2016.2576643.
Wang, et al.; A 0.45-V, 14.6-nW CMOS Subthreshold Voltage Reference With No Resistors and No BJTs, IEEE Transactions on Circuits and Systems II: Express Briefs; vol. 62, No. 7; Jul. 2015 DOI: 10.1109/TCSII.2015.2415292.
PCT International Search Report and Written Opinion; PCT/GB2019/052517; dated Dec. 13, 2019.

* cited by examiner

COMPARISON OF A VOLTAGE SIGNAL TO A REFERENCE

GOVERNMENT LICENSE RIGHTS

This invention was made with government support under Agreement No. HR0011-17-9-0025, awarded by DARPA. The government has certain rights in the invention.

TECHNICAL FIELD

This disclosure relates to comparison of a voltage signal, such as a voltage signal from a battery or other energy source, with a reference voltage.

BACKGROUND

As portable devices, such as hand-held computers, gaming devices, communications devices, smart phones, and so forth, continue to increase in popularity, a need for long-lasting onboard power sources, such as an onboard battery, for example, has become particularly apparent. Accordingly, many portable devices utilize battery measurement methods and/or dedicated measurement circuitry, which allow a user, for example, to be at least occasionally informed of the condition of, for example, an onboard battery. In many instances, responsive to a determination that battery capacity has been significantly depleted, a portable device, for example, may provide a signal to indicate, for example, that battery capacity has fallen below a threshold capacity.

However, although portable device users may appreciate being informed of the condition of a battery, for example, as well as being alerted that a battery charge has fallen below a threshold capacity, such users may be opposed to the notion of battery measurement circuitry, for example, consuming significant battery resources. Accordingly, providing low-power battery condition monitoring and/or battery condition alerts continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Figure 1:
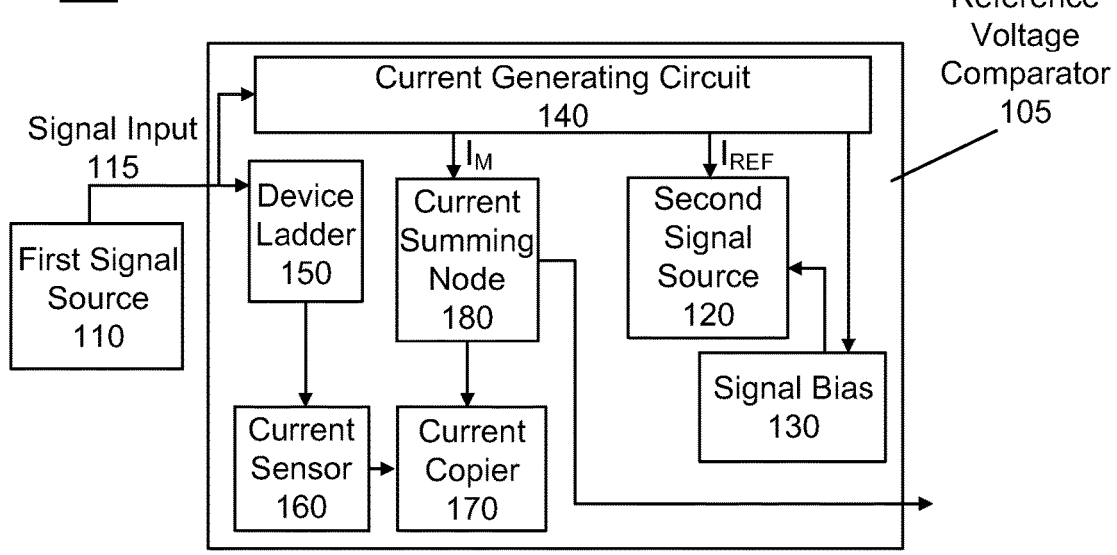
FIG. 1 is a block diagram illustrating a system for comparing a voltage signal to a reference in accordance with various embodiments described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously alluded to, portable devices, such as hand-held computers, gaming devices, communications devices, smart phones, and so forth, continue to gain in popularity and appeal. Additionally, as many portable electronic devices utilize a battery or other type of energy storage device, a portable electronic device may benefit from one or more onboard battery measurement approaches. An onboard battery measurement technique, which may utilize comparison of a voltage signal to a reference signal, may enable the portable electronic device to provide useful battery parameters, such as indications of reduced battery voltage, battery voltage dropouts (e.g., brownout), battery overvoltage, just to name a few examples. Such indications may permit users of portable devices to take corrective actions, such as reinstalling one or more improperly installed batteries, replacing a battery, charging a battery, and so forth. In other instances, such as responsive to a battery voltage dropout (e.g., brownout), an onboard battery measurement technique may be utilized to indicate a need for a memory re-initialization process. In certain embodiments, a memory re-initialization process may enhance reliability of a portable electronic device, which may include memory circuits comprising contents that may be degraded by abrupt and unplanned interruption of battery power. Such re-initialization of memory circuits responsive to brownouts, for example, may be particularly useful in energy-harvesting applications in which, for example, voltage dropouts and/or brownouts may frequently occur.

In particular embodiments, comparison of a voltage signal to a reference, such as described herein, may utilize electronic components that consume only a small quantity of electrical power, such as less than 500.0 picoWatt (500.0 pW). In some embodiments, an onboard battery measurement approach may consume an even smaller quantity of electrical power, such as less than 200.0 pW. Accordingly, an onboard battery measurement approach may consume only a tiny fraction of battery resources utilized to perform normal portable device functions, such as communications, processing, and so forth. Thus, in some embodiments, in which portable devices may be placed into an inactive state for extended periods of time, a user may be confident that, when activated, the portable device is ready for operational use.

In particular embodiments, an apparatus utilized to perform comparison of a voltage signal to a reference may comprise electronic components formed according to a single fabrication process, such as a thick-oxide process, or a thin-oxide process. Thus, as electronic components utilized to construct the apparatus, such as transistors, diodes, and so forth, undergo age-related and/or temperature-related variations in impedance parameters, such variations may occur in a predictable manner across all similarly constructed electronic components. In other words, utilization of a single fabrication process may be utilized to form electronic components in which changes in the behavior of one or more first electronic components may be compensated for, without user input, by way of changes in the behavior of one or more other electronic components. Use of a single fabrication process to form substantially all electronic components of an apparatus may bring about additional benefits, such as reduction in process complexity cost, and so forth, and claimed subject matter is not limited in this respect.

Before discussing embodiments in reference to the accompanying figures, a brief description of various non-limiting embodiments is provided. For example, an apparatus may compare an amplitude of a first signal to a second signal. In one embodiment, a first signal may comprise a signal originating from a chemical storage element (e.g., a battery), a direct-current power bus, energy harvesting equipment, or the like. A second signal may comprise a signal originating from a reference source. The apparatus may further comprise one or more current-mirroring circuits, which may substantially replicate an electric current value, or generate a multiple of the electric current value, wherein the electric current through the one or more devices is induced via applying the first signal to the at least one of the one or more devices. In addition, the apparatus may comprise an output signal node, which may be connected or coupled to at least one of the one or more current-mirroring circuits, to provide a first signal when the amplitude of the first signal is greater than the amplitude of the second signal. The output signal node may provide a second signal when the amplitude of the first signal is less than the amplitude of the second signal.

In another embodiment, a method may comprise replicating an electric current, or generating a multiple of the electric current, through one or more devices induced via applying a first signal to at least one of the one or more devices. The method may continue with indicating, via providing a first output signal state, when the amplitude of the first signal is greater than the amplitude of a second signal. The method may further include indicating, via providing a second output signal state, when the amplitude of the first signal is less than the amplitude of the second signal.

In yet another embodiment, an apparatus may comprise a current generator to generate a first electric current based, at least in part, on a second electric current through one or more transistors devices operating in a sub-threshold state. As described herein, a sub-threshold state may comprise a transistor state in which an induced current may be exponentially related to an applied voltage. A current summing node may be coupled to the current generator to provide an output signal having a first level when the current through the plurality of transistor devices is relatively high. The current summing node may provide an output signal having a second level when the current through the plurality of the transistor devices is relatively low.

In still another embodiment, an apparatus may provide an indication of an overvoltage condition of, for example, a battery, which may operate to protect potentially sensitive components from harmful effects of excess voltage. The apparatus may additionally provide an indication of a brownout or a drop in a voltage supplied by, for example, a battery. Such an indication may indicate a need for a memory reinitialization process, for example, of computer memory that receives electric power from the battery.

Particular embodiments will now be described with reference to the figures, such as FIG. 1, which comprises a block diagram illustrating a system 100 for comparing a voltage signal to a reference in accordance with embodiments described herein. As shown in FIG. 1, first signal source 110 may be coupled to signal input 115 of reference voltage comparator 105. First signal source 110 may comprise an output signal, such as a voltage, from a chemical storage element, such as a battery. In one embodiment, first signal source 110 may comprise an output signal from another type of signal source, such as a power bus (e.g., a direct-current power bus). In other embodiments, first signal source 110 may comprise an output signal from an energy harvesting device or system, such as one or more solar cells, one or more wind-power generators, one or more geothermal power generators, or any other type of device capable of providing a voltage signal, for example, to reference voltage comparator 105, and claimed subject matter is not limited in this respect.

A signal from first signal source 110 may be coupled, via signal input 115, to current generating circuits 140, which may operate to provide primary power to the remaining components of reference voltage comparator 105. In addition to coupling to current generating circuits 140, first signal source 110 may additionally provide a signal, such as a voltage signal, to device ladder 150. In a particular embodiment, device ladder 150 may comprise a number of transistor devices, such as transistors configured as diodes, coupled in a series relation. In other embodiments, device ladder 150 may comprise one or more other types of devices in which, as described hereinbelow, electric current flow through device ladder 150 may be exponentially related to an applied voltage.

An electric current coupled from a first signal source 110 and through device ladder 150 may be delivered to current sensor 160. In particular embodiments, current sensor 160 may comprise, for example, an input signal side of a MOSFET current mirror, in which an electric current flowing through current sensor 160 may be replicated, at least in one embodiment, through current copier 170. In particular embodiments, such as described with respect to FIG. 2, current copier 170 may comprise "K" additional circuit elements, such as MOSFET transistors, which may bring about an electric current flow that is substantially equal to a multiple (K) of an electric current flowing through current sensor 160.

In FIG. 1, current generating circuits 140 may comprise one or more relatively stable sources of electric current, which may flow, for example, to current summing node 180 and in the direction of current copier 170. Thus, when current copier 170 permits passage of only a relatively small or negligible electric current, for example, a voltage measured at current summing node 180 may comprise a relatively high voltage. In some embodiments, a relatively high voltage measurable at current summing node 180 may be brought about responsive to an accumulation of electrical charges from current generating circuits 140, which are not permitted to flow through current copier 170. Conversely, when current copier 170 permits passage of a relatively large or substantial electric current, a voltage measured at current summing node 180 may comprise a relatively low voltage. In other embodiments, a relatively low voltage measurable at current summing node 180 may be brought about responsive to a dispensing of significant electric current through current copier 170 towards, for example, a local signal ground (not shown in FIG. 1).

In FIG. 1, a voltage measurable at current summing node 180 may be compared with, or referenced to, a second signal source, such as second signal source 120. In particular embodiments, second signal source 120 may comprise a voltage reference that may be maintained above a ground potential such as, for example, 1.0 volts DC, 1.5 volts DC, or any other potential, and claimed subject matter is not limited in this respect. Second signal source 120 may comprise one or more transistors or transistor-containing devices, which may be biased via signal bias 130. In a particular embodiment, such as described in reference to FIG. 2, signal bias 130 may comprise a MOSFET device capable of being body-biased so as to permit adjustment of a threshold voltage at which an appreciable electric current may flow, for example, between source and drain terminals of the MOSFET device.

Thus, in FIG. 1, second signal source 120 may be biased so as to permit only a small electric current (as shown as $I_{REF}$ in FIG. 1), such as an electric current of less than 500.0 picoAmpere (pA), just as a nonlimiting example, to flow from an output port of current generating circuit 140 to a local signal ground (not shown in FIG. 1). Additionally, at least in particular embodiments, current generating circuit 140 may perform a current mirroring operation, in which an electric current $I_{REF}$ may flow from one or more other output ports of current generating circuit 140. Thus, at least a second current, shown as $I_M$ in FIG. 1, which may be substantially equal to reference current $I_{REF}$, may be generated by current generating circuit 140 for delivery to current summing node 180 and, in turn, to current copier 170. Accordingly, as previously discussed herein, when current copier 170 permits passage of only a relatively small or negligible electric current, for example, a voltage measured at current summing node 180 may comprise a relatively high voltage. Conversely, when current copier 170 permits passage of a relatively large or substantial electric current, for example, a voltage measured at current summing node 180 may comprise a relatively low voltage. Further, and also as previously discussed herein, regulation of electric current flow, such as utilizing current copier 170, for example, may be based, at least in part, on electric current flow through device ladder 150.

Figure 2:
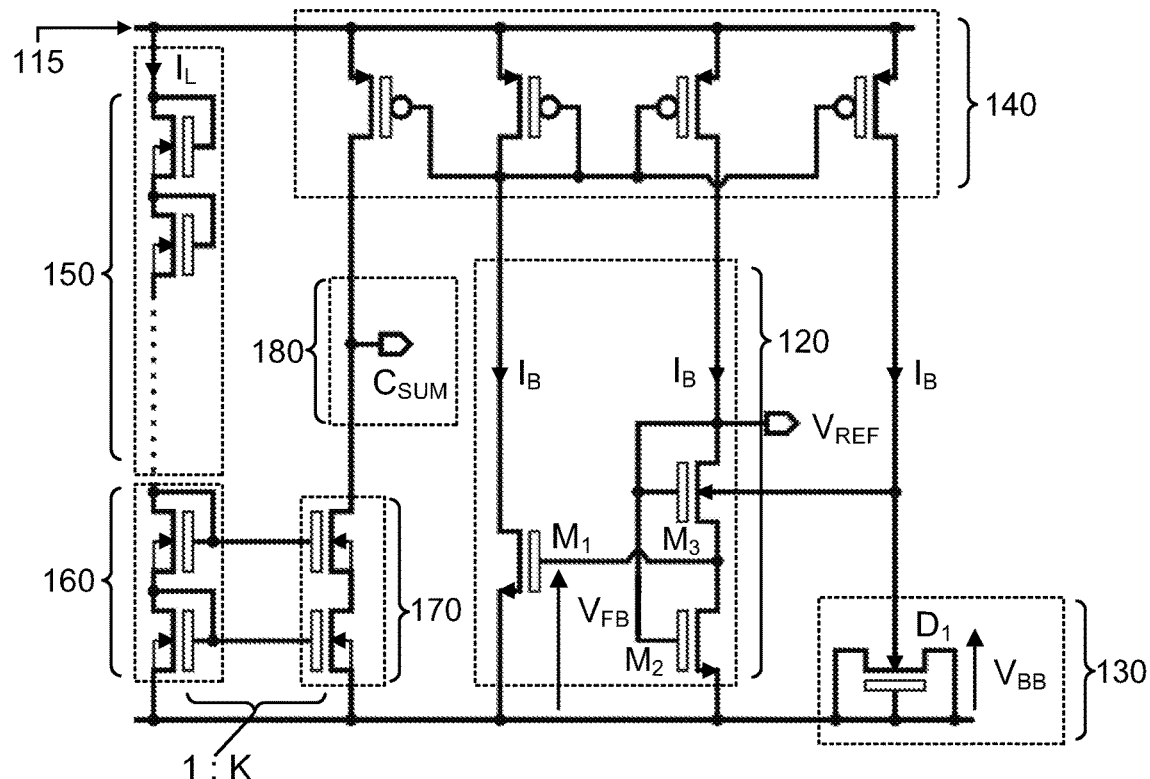
FIG. 2 is a circuit diagram illustrating a particular implementation of a system adapted to perform a voltage comparison function similar to that described in reference to FIG. 1, according to an embodiment.

FIG. 2 is a circuit diagram 200 illustrating a particular implementation of a system, which may perform a voltage comparison function similar to that described in reference to FIG. 1. In FIG. 2, a self-biased, self-cascode arrangement may, for example, utilize a body biased bulk-source/drain junction of a transistor, such as transistor $D_1$, to form signal bias 130. As shown in FIG. 1, signal bias 130 receives an electric current from current generating circuit 140 proportional to $I_{REF}$. It may be appreciated that use of a bulk-source/drain junction of a transistor configured to operate as a diode, utilizing similar, or even identical, types of N-channel MOSFET transistors utilized to form transistors $M_3$ and $M_2$ of signal source 120, may reduce the effect of wafer-to-wafer implant variations, doping variations, and other fabrication process-related variations. For example, although dopant concentration among transistors may vary, which may bring about differing transistor properties, overall transistor operation parameters may vary only slightly, or may vary within acceptable limits. In some embodiments, transistor $D_1$ may provide, for example, thermal characteristics that depend on diode saturation current rather than saturation current and threshold voltage. Thus, the arrangement of transistor $D_1$ to form signal bias 130 may simplify computation of thermal characteristics of the self-cascode reference that forms second signal source 120.

In FIG. 2, transistor $M_2$ may be sized to operate in a weak-inversion mode, which, in this context, is defined as a mode of transistor operation in which a gate-to-source voltage, for example, is not permitted to increase beyond the turn-on threshold of the transistor. Accordingly, in the embodiment of FIG. 2, operation of transistor $M_2$ in a weak-inversion mode comprises operation of the transistor in a mode wherein drain current may be independent from, or perhaps substantially uncorrelated to, a drain voltage, at least for drain voltages higher than approximately 100.0 mV. Such operation may be characterized substantially in accordance with expression (1) below:

$$I_{D2} = I_{S_2} \exp\left(\frac{V_{G2} - V_{T_2}}{n_2 \Phi_t}\right) \tag{1}$$

wherein $I_{S_2}$ of expression (1) comprises electric current through the transistor that may depend, at least in part, upon transistor design parameters, such as width (W) and the length (L) within limits permitted by a particular manufacturing process. Also in expression (1), $n_2$ comprises a process-defined sub-threshold slope factor, $\Phi_t$ comprises a thermal voltage, $V_{G2}$ comprises the gate-source voltage of transistor $M_2$, and $V_{T_2}$ comprises the threshold voltage of transistor, which may be dependent, at least in part, on the threshold voltage of $M_2$. By rearranging terms of expression (1), the reference voltage, as indicated by $V_{REF}$ at a node of second signal source 120 may be characterized substantially in accordance with expression (2), below:

$$V_{REF} = V_{T_2} + n_2 \Phi_t \ln\left(\frac{I_b}{I_{S_2}}\right) \tag{2}$$

From expression (2), a voltage across the self-cascode structure comprising $M_2$ and $M_3$ appears to depend, at least substantially, on characteristics of $M_2$ and a bias current. In particular embodiments, the threshold voltage ($V_{T_2}$) in expressions (1) and (2) may be characterized as comprising a complementary-to-ambient-temperature (CTAT) property, while the remaining portion of expression (2) (e.g., $n_2 \Phi_t \ln(I_b/I_{S_2})$) appears to be comprise a proportional-to-ambient-temperature (PTAT) property that depends, at least substantially, on bias current $I_b$. In typical applications, such dependencies may give rise to variations, such as significant variations, in transistor threshold voltages.

In FIG. 2, bias current of the self-cascode structure of $M_2$ and $M_3$ may depend, at least in large part, on a voltage-to-current characteristic of $M_1$, which may be calculated substantially in accordance with expression (3), below:

$$V_{FB} = V_{gs_2} V_{gs_3} \quad (3)$$

wherein $V_{gs_2}$ and $V_{gs_3}$ comprise gate-to-source voltages for transistors $M_2$ and $M_3$ respectively. In some embodiments, such as those in which all transistors may be designed to operate in a sub-threshold mode, $V_{FB}$ may be expressed in terms of a difference between a threshold voltage of $M_2$ and a threshold voltage of $M_3$ in view of the logarithmic relationship of expression (2). Performing such substitutions in expression (2) results in expression (4), below:

$$V_{FB} = V_{T_2} - V_{T_3} + \Phi_t \ln\left(\frac{I_{S_3}^{n_3} I_b^{n_2}}{I_{S_2}^{n_2} I_b^{n_3}}\right) \quad (4)$$

Applying a body-bias voltage, such as shown by $V_{BB}$ across $D_1$ in FIG. 2, to the body of transistor $M_3$ may operate to alter, such as to decrease, for example, the threshold voltage of $M_3$. Accordingly, the threshold voltage of transistor $M_3$ may be expressed substantially in accordance with expression (5), below:

$$V_{T_3} = V_{T_{3/0}} + \gamma(\sqrt{2\Phi_f + V_{SB}} - \sqrt{2\Phi_f}) \quad (5)$$

wherein $V_{T_{3/0}}$ corresponds to the threshold voltage of transistor $M_3$ without body biasing. $V_{SB}$ of expression (5) corresponds to the source bulk voltage of the transistor, $\Phi_f$ corresponds to the Fermi potential, and $\gamma$ corresponds to the body effect constant. Expression (5) may be approximated, at least in particular embodiments, substantially in accordance with expression (6), below:

$$V_{T_3} \approx V_{T_{0_3}} \alpha V_{SB} = V_{T_{0_3}} \alpha (V_{FB} - V_{BB}) \quad (6)$$

Wherein α represents a constant utilized in providing a first-order approximation. For example, it may be assumed that in the vicinity of an operating point, the voltage may be linearly related to the operating point. It may also be assumed that accuracy of the first-order approximation may degrade with increased separation from the operating point. In FIG. 2, $V_{FB}$ may be approximated utilizing expression (6). Thus, expression (4) may be expressed substantially in accordance with expression (7), below:

$$V_{FB} = \frac{1}{1+\alpha}\left[V_{T_2} - V_{T_{0_3}} + \alpha V_{BB} + \Phi_t \ln\left(\frac{I_{S_3}^{n_3} I_b^{n_2}}{I_{S_2}^{n_2} I_b^{n_3}}\right)\right] \quad (7)$$

The body-bias voltage applied to transistor $M_3$ may follow a simplified diode equation such as, for example, in accordance with expression (1). In particular embodiments, assuming that a voltage across diode $D_1$ is greater than approximately 100.0 mV, although claimed subject matter is not limited in this respect, and that despite forward biasing of diode $D_1$, there is negligible electric current through the bulk of transistor $M_3$. Under such conditions, the bulk-source junction of transistor $M_3$ may be forward biased to approximately 0.25 V, although claimed subject matter is not limited in this respect. Thus, $V_{BB}$ across diode $D_1$ may be expressed substantially in accordance with expression (8), below:

$$V_{BB} \approx n_d \Phi_t \ln\left(\frac{I_b}{I_{S_{D_1}}}\right) \quad (8)$$

Under such conditions, a feedback voltage ($V_{FB}$) may be computed substantially in accordance with expression (9), below:

$$V_{FB} = \frac{1}{1+\alpha}\left[V_{T_2} - V_{T_{0_3}} + \alpha n_d \Phi_t \ln\frac{I_b}{I_{S_{D_1}}} + \Phi_t \ln\left(\frac{I_{S_3}^{n_3} I_b^{n_2}}{I_{S_2}^{n_2} I_b^{n_3}}\right)\right] \quad (9)$$

Thus, in accordance with expression (9), transistor $M_1$ may operate in a sub-threshold region. Further, drain current of transistor $M_1$ may comprise a quantity at least approximately equal to the self-cascode structure of transistors $M_2$ and $M_3$. Thus, expression (9) may be rewritten substantially in accordance with expression (10), below:

$$V_{T_1} + \Phi_t \ln\left(\frac{I_b^{n_1}}{I_{S_1}^{n_1}}\right) = \frac{1}{1+\alpha}\left[V_{T_2} - V_{T_{0_3}} + \alpha n_d \Phi_t \ln\frac{I_b}{I_{S_{D_1}}} + \Phi_t \ln\left(\frac{I_{S_3}^{n_3} I_b^{n_2}}{I_{S_2}^{n_2} I_b^{n_3}}\right)\right] \quad (10)$$

Rearranging terms of expression (10) yields an expression substantially in accordance with expression (11), below:

$$V_{REF} = \frac{V_{T_2}(n_1(1+\alpha) + n_3 - \alpha n_d) - n_2(1+\alpha)V_{T_1} - n_2 V_{T_{0_3}}}{(n_1(1+\alpha) + n_3 - n_2 - \alpha n_d)} + \frac{n_2 \Phi_t}{(n_1(1+\alpha) + n_3 - n_2 - \alpha n_d)} \ln\left(\frac{I_{S_1}^{n_1(1+\alpha)} I_{S_3}^{n_3}}{I_{S_2}^{n_1(1+\alpha)+n_3-\alpha n_d} I_{S_{D_1}}^{\alpha n_d}}\right) \quad (11)$$

It should be noted that sub-threshold of slope factors for $M_1$, $M_2$, and $M_3$ (e.g., $n_1$, $n_2$, and $n_3$) may be assumed to be substantially identical, in view of fabrication of $M_1$, $M_2$, and $M_3$ utilizing a single process such as, for example, a thick-oxide process, a thin-oxide process, and so forth. Further, assuming that the diode quality factor for $D_1$ of FIG. 2 is sufficiently close to 1.0, expression (11) may be rewritten substantially in accordance with expression (12), below:

$$V_{REF} \approx \frac{V_{T_2}(2n + \alpha n - \alpha) - (n + \alpha n)V_{T_1} - n V_{T_{0_3}}}{n + \alpha n - \alpha} + \frac{n \Phi_t}{n + \alpha n - \alpha} \ln\left(\frac{I_{S_1}^{n+\alpha n} I_{S_3}^{n}}{I_{S_2}^{2n+\alpha n-\alpha} I_{S_{D_1}}^{\alpha}}\right) \quad (12)$$

Thus, as indicated via expression (12), 4 at least in particular embodiments, reference voltage ($V_{REF}$) may comprise little or no dependency on parameters of a single transistor (e.g., $M_1$, $M_2$, $M_3$). Rather, $V_{REF}$ may depend, at least substantially, on ratios and differences between parameters of transistors $M_1$, $M_2$, $M_3$, for example. Accordingly, $V_{REF}$ of FIG. 2 performs one or more functions to self-compensate for changes in transistor thresholds as well as other changes, such as changes in saturation currents of transistors $M_1$, $M_2$, and $M_3$.

With respect to temperature analysis, the arrangement of FIG. 2 may give rise to sub-threshold slope factors that remain substantially stable with increases and decreases in ambient temperature. In particular embodiments, a body-bias threshold characteristic (α) of the particular transistors may vary by a small amount, such as +/−3.0%, for example, over an extended temperature range. However, it should be noted that claimed subject matter is intended to embrace other ranges of variation in a such as amounts less than +/−3.0%, such as +/−2.0% or +/−1.0%, as well as amounts greater than +/−3.0%, such as +/−4.0%, +/−5.0%, and so forth. In certain embodiments, a temperature stable voltage reference may be obtained via setting $$\frac{\partial V_{REF}}{\partial T} = 0,$$

substantially in accordance with expression (13), below, which utilizes, as a basis, the expression for $V_{REF}$ as given by expression (12):

$$\frac{\partial V_{REF}}{\partial T} = 0 = \frac{2n + \alpha n - \alpha}{n + \alpha n - \alpha} \frac{\partial V_{T_2}}{\partial T} - \frac{n + \alpha n}{n + \alpha n - \alpha} \frac{\partial V_{T_1}}{\partial T} - \frac{n}{n + \alpha n - \alpha} \frac{\partial V_{T_{03}}}{\partial T} + \frac{n}{n + \alpha n - \alpha} \ln\left(\frac{I_{S_1}^{n+\alpha n} I_{S_3}^{n}}{I_{S_2}^{2n+\alpha n-\alpha} I_{S_{D1}}^{\alpha}}\right) \frac{\partial \Phi_t}{\partial T}$$ (13)

In particular embodiments, voltage thresholds of selected transistors, such as $M_1$, $M_2$, and $M_3$, may vary, such as rising and falling, with temperature and with a slope comprising between, for example −1.1 mV/° C. and −1.2 mV/° C. However, it should be noted that claimed subject matter is intended to embrace rising and falling voltage thresholds comprising different slopes, such as, for example, between −1.0 mV/° C. and −1.4 mV/° C. as a function of ambient temperature. Accordingly, when transistors $M_1$, $M_2$, and $M_3$, are fabricated utilizing substantially identical processes, (e.g., a thick-oxide process, a thin-oxide process, and so forth) voltage thresholds of transistors $M_1$, $M_2$, and $M_3$ may vary, such as rising and falling, commensurately with one another. Such commensurate varying of voltage thresholds as a function of ambient temperature may be expressed substantially in accordance with expression (14):

$$\frac{\partial V_{T_2}}{\partial T} \approx \frac{\partial V_{T_1}}{\partial T} \approx \frac{\partial V_{T_{03}}}{\partial T} = \frac{\partial V_T}{\partial T}$$ (14)

Expression (13) may thus be simplified, utilizing expression (14), to yield in expression substantially in accordance with expression (15A), below:

$$\frac{\partial V_{REF}}{\partial T} = 0 = \frac{-\alpha}{n + \alpha(n-1)} \frac{\partial V_T}{\partial T} + \frac{n}{n(1+\alpha) - \alpha} \cdot \frac{k}{q} \ln\left(\frac{I_{S_1}^{n+\alpha n} I_{S_3}^{n}}{I_{S_2}^{2n+\alpha n-\alpha} I_{S_{D1}}^{\alpha}}\right)$$ (15A)

wherein k in expression (15A) corresponds to Boltzmann's constant (approximately equal to $1.38 \times 10^{-23}$ J/K) and wherein q corresponds to the value of an elementary charge ($1.602 \times 10^{-19}$ C). From expression (15A), it may be appreciated that temperature-dependent terms of the saturation currents, such as the product of $I_{S_1}^{n+\alpha n}$ and $I_{S_3}^{n}$ as well as the product of $I_{S_2}^{2n+\alpha n-\alpha}$ and $I_{S_{D1}}^{\alpha}$ cancel so as to yield approximately 1.0. Thus, expression (15A) may simplify to yield expression (15B), below:

$$\frac{\partial V_{REF}}{\partial T} = 0 = \frac{-\alpha}{n + \alpha(n-1)} \frac{\partial V_T}{\partial T} + \frac{n}{n(1+\alpha) - \alpha} \cdot \frac{k}{q} \ln(1.0)$$ (15B)

Expression (15B) may further simplify to yield expression (15C), below:

$$\frac{\partial V_{REF}}{\partial T} = \frac{-\alpha}{n + \alpha(n-1)} \frac{\partial V_T}{\partial T} + 0$$ (15C)

It is noteworthy that, in accordance with expression (15C), responsive to transistors $M_1$, $M_2$, and $M_3$ being fabricated utilizing substantially identical processes, (e.g., a thick-oxide process or a thin-oxide process) voltage thresholds of transistors $M_1$, $M_2$, and $M_3$ may vary, such as rising and falling, commensurately with one another as a function of ambient temperature. In particular embodiments, rising and falling of the voltage thresholds of transistors $M_1$, $M_2$, and $M_3$ may remain commensurate with one another over a wide temperature range, such as a temperature range of about −25.0° C. to about +125.0° C. although claimed subject matter is not limited in this respect.

With respect to the sub-threshold slope factors (e.g., $n_1$, $n_2$, and $n_3$), which may be assumed to be identical to one another responsive to use of a single process utilized in fabrication of transistors $M_1$, $M_2$, and $M_3$, the sub-threshold slope factors may comprise values greater than 1.0, at least in particular embodiments. Sub-threshold slope factors greater than 1.0 may be brought about in view of dependence of the slope factors on depletion layer capacitance ($C_{dep}$) and on oxide capacitance ($C_{ox}$), such as expressed substantially in accordance with expression (16), below:

$$n = 1 + \frac{C_{dep}}{C_{ox}}$$ (16)

In addition, in view of the body-bias threshold characteristic ($\alpha$) being positive, expression (17) follows:

$$\frac{-\alpha}{n + \alpha(n-1)} < 0$$ (17)

It may be appreciated that the above expression $$\left(\frac{-\alpha}{n + \alpha(n-1)}\right)$$

appears to comprise a quantity that is proportional to ambient temperature in view of the threshold temperature comprising a negative thermal coefficient multiplied by a negative term. Accordingly, referring back to expression (15A), the quantity $$\frac{n}{n(1+\alpha) - \alpha} \cdot \frac{k}{q} \ln\left(\frac{I_{S_1}^{n+\alpha n} I_{S_3}^{n}}{I_{S_2}^{2n+\alpha n-\alpha} I_{S_{D1}}^{\alpha}}\right),$$

which may indicate a negative relationship with ambient temperature, may permit design of transistors, for example, in which overall dependence on ambient temperature may vary only slightly, or may vary within particular limits. Permit design of transistors, for example, to cancel. For example, referring to expression (15A), the $I_s$ terms (e.g., $I_{S_1}^{n+\alpha n}$, $I_{S_3}^{n}$, $I_{S_2}^{2n+\alpha n-\alpha}$, and $I_{S_{D1}}^{\alpha}$) may depend on transistors dine parameters, such as width (W) and a length (L). Thus, via selection of appropriate W and L values, $I_s$ terms may be defined. Accordingly, $$\left(\frac{I_{S_1}^{n+\alpha n} I_{S_3}^n}{I_{S_2}^{2n+\alpha n-\alpha} I_{S_{D1}}^\alpha}\right)$$

may be adjusted to at least substantially cancel contributions from $$\left(\frac{-\alpha}{n+\alpha(n-1)}\right)$$

of expression (15A). In particular embodiments $$\frac{-\alpha}{n+\alpha(n-1)}$$

may comprise a quantity that is complementary to ambient temperature. Such a property may be achieved via adjusting size ratios of transistors $M_1$, $M_2$, and $M_3$.

Thus, as second signal source 120 of FIG. 2 has been shown to exhibit a reference voltage ($V_{REF}$) that may remain stable despite changes in ambient temperature, second signal source 120 may be utilized to as a source of a stable reference signal in an apparatus to compare an amplitude of a signal source, such as first signal source 110 of FIG. 1, with a reference signal. In one embodiment, signal input 115, which may originate from first signal source 110, for example, may be coupled to device ladder 150. In another embodiment, device ladder 150 may comprise two or more serially-connected transistors configured for operation as diodes. Accordingly, responsive to the formation of the serially-connected transistors of device ladder 150 by way of a single fabrication process, a voltage drop across an individual transistor of device ladder 150 may be expressed substantially in accordance with expression (18), below:

$$V_{ds_i} = V_{gs_i} = \frac{V_{bat}}{N} \quad (18)$$

wherein "N" comprises the number of transistors serially connected, or least coupled, in device ladder 150. $V_{ds_i}$ comprises the drain-to-source voltage across a transistor of device ladder 150 and $V_{gs_i}$ comprises the gate-to-source voltage across a transistor of device ladder 150. It should be noted that although only two serially-connected transistors are shown in FIG. 2, claimed subject matter is intended to embrace any number of serially-connected transistors, such as five transistors, eight transistors, and so forth, virtually without limitation.

In view of the serial connection of drain-to-source currents through the individual transistors of device ladder 150, expression (18) may be rewritten in terms of a bulk-source connected transistor operating in a sub-threshold mode, substantially in accordance with expression (19), below:

$$I_L = I_{S_i} e^{\left(\frac{V_{gs_i}-V_{T_i}}{n\Phi_t}\right)}\left[1 - e^{\left(-\frac{V_{gs_i}}{\Phi_t}\right)}\right] \quad (19)$$

In expression (19), $V_{gs_i}$ comprises the gate-to-source voltage of an individual transistor of device ladder 150, $V_{T_i}$ comprises the threshold voltage of the individual transistor, n comprises a process-defined sub-threshold slope factor, and $\Phi_t$ comprises a thermal voltage. Replacing $V_{gs_i}$ of expression (19) with $$\frac{V_{bat}}{N},$$

in accordance with expression (18) and assuming that $V_{gs_i} \gg \Phi_t$, brings about expression (20), below:

$$I_L = I_{S_i} \exp\left(\frac{\frac{V_{FSS}}{N} - V_{T_i}}{n_i \Phi_t}\right) \quad (20)$$

As previously described herein, such as in reference to expression (15C), reference voltage ($V_{REF}$), which may correspond to an output signal of second signal source 120 in the embodiment of FIG. 2, maintains a substantially constant value over a wide temperature range. In particular embodiments, such a temperature range may comprise about −25.0° C. to about +125.0° C. Utilizing expression (1) as a basis to compute a value of an electric current through transistor $M_2$, the expression may be rewritten as expression (21), below:

$$I_b = I_{S_2} \exp\left(\frac{V_{REF} - V_{T_2}}{n_2 \Phi_t}\right) \quad (21)$$

wherein the substitution $V_{REF} = V_{G2}$ has been made.

It may be appreciated that an electric current comparison may be performed via the coupling of two current mirrors to generate an electric current of, for example, $I_b$ as expressed in expression (21). However, claimed subject matter may embrace any number of current mirrors, such as three current mirrors, four current mirrors, and so forth. As shown in FIG. 2, device ladder 150 may comprise a plurality of N-type MOS transistors, which may be configured to operate as diodes. Thus, copying or replicating current $I_L$ through the serially-connected transistors of device ladder 150 may be performed via an N-type MOS transistor current mirror. In contrast, bias current of transistor $M_1$ of second signal source 120 may be provided via a P-type MOS current source. Thus, responsive to an electric current comparison between $I_L$ and $I_B$, the signal level at signal current summing node 180 ($C_{SUM}$) may provide an indication of $I_L$ relative to $I_B$ substantially in accordance with expression (22A), below:

$$V_{DTCT} = \begin{cases} '1', & I_L < I_B \\ '0', & I_L > I_B \end{cases} \quad (22A)$$

Thus, in accordance with expression (22A), an output signal from current summing node 180 ($C_{SUM}$) may be interpreted as a logic "1" when $I_L$ is less than $I_B$, which may indicate an accumulation of electrical charges at current copier 170. Such a condition may occur responsive to current sensor 160 sensing only a small electric current $I_L$, which may be induced by a relatively low-level signal input 115, through device ladder 150. Conversely, an output signal from current summing node 180 may be interpreted as a logic "0" when $I_L$ is greater than $I_B$, which may indicate an increased electric current flow through current copier 170. Such a condition may occur responsive to current sensor 160 sensing increased electric current $I_L$ (which may be induced by a higher-level signal input 115) through device ladder 150. It should be noted that although current sensor 160 and current copier 170 indicate a cascoded current mirror arrangement, which may enhance noise immunity of current sensor 160 and current copier 170, embodiments of claimed subject matter are intended to embrace non-cascoded current mirror arrangements.

It should be noted, however, that in particular embodiments, it may be advantageous for current copier 170 to provide a capability for an increased electric current flow, such as a multiple "K," with respect to a current $I_L$ through device ladder 150. In one embodiment, a multiple of a current $I_L$ through device ladder 150 may be realized via coupling current sensor 160 to current copier 170, which may be arranged in a cascoded configuration (as shown) or a non-cascoded configuration. Under such conditions, an output signal from current summing node 180 ($C_{SUM}$) may be interpreted as a logic "1" when a multiple (K) of $I_L$ is less than $I_B$. Conversely, an output signal from current summing node 180 ($C_{SUM}$) may be interpreted as a logic "0" when a multiple (K) of $I_L$ is less than $I_B$. Such an approach may be implemented substantially in accordance with expression (22B), below:

$$V_{DTCT} = \begin{cases} '1', & K \cdot I_L < I_B \\ '0', & K \cdot I_L > I_B \end{cases} \quad (22B)$$

An approach that accords with expression (22B) may provide an advantage over an approach that accords with expression (22A) by way of providing a capability to perform a current comparison function utilizing only a fraction (e.g., $$\frac{1}{K}$$

of the electric current through device ladder 150.

In accordance with expression (22B), a logic threshold of $V_{DTCT}$ may be defined when an electric current through current copier 170 approaches, or matches, $I_B$ (e.g., $I_B = KI_L$). Thus, expression (23) follows:

$$I_B - KI_L = 0 \quad (23)$$

Further, replacing currents $I_B$ and $I_L$ as functions of parameters of transistor $M_2$ yields expression (24), below:

$$I_{S_2} \exp\left(\frac{V_{REF} - V_{T_2}}{n_2 \Phi_t}\right) - K \cdot I_{S_i} \exp\left(\frac{\frac{V_{FSS}}{N} - V_{T_i}}{n_i \Phi_t}\right) = 0 \quad (24)$$

wherein, the substitution $$I_{S_2} \exp\left(\frac{V_{REF} - V_{T_2}}{n_2 \Phi_t}\right)$$

has been made for $I_B$ and wherein the substitution $$K \cdot I_{S_i} \exp\left(\frac{\frac{V_{FSS}}{N} - V_{T_i}}{n_i \Phi_t}\right)$$

has been made for $KI_L$. In addition, when $I_{S_2} = K \cdot I_{S_i}$, expression (25) results:

$$\frac{V_{ref} - V_{T_i}}{n_i \Phi_t} = \ln K + \frac{\frac{V_{FSS}}{N} - V_{T_i}}{n_i \Phi_t} \quad (25)$$

Rearranging terms in expression (25) yields a condition under which current summing node 180 triggers as a function of the amplitude of first signal source 110 and the amplitude of second signal source 120 ($V_{REF}$), such as:

$$V_{bat} = N[V_{ref} - n_i \Phi_t \ln(K)] \quad (26)$$

Thus, when "K" is equal to 1.0 (which implies that $n_i \Phi_t \ln(K) = 0$), current summing node 180 ($C_{SUM}$) triggers at a voltage that is substantially temperature independent. In some embodiments, such temperature independence may be maintained between, for example, about $-25.0°$ C. and about $+125.0°$ C., in accordance with expression (27), below:

$$V_{bat} = NV_{ref} \quad (27)$$

Figure 3:
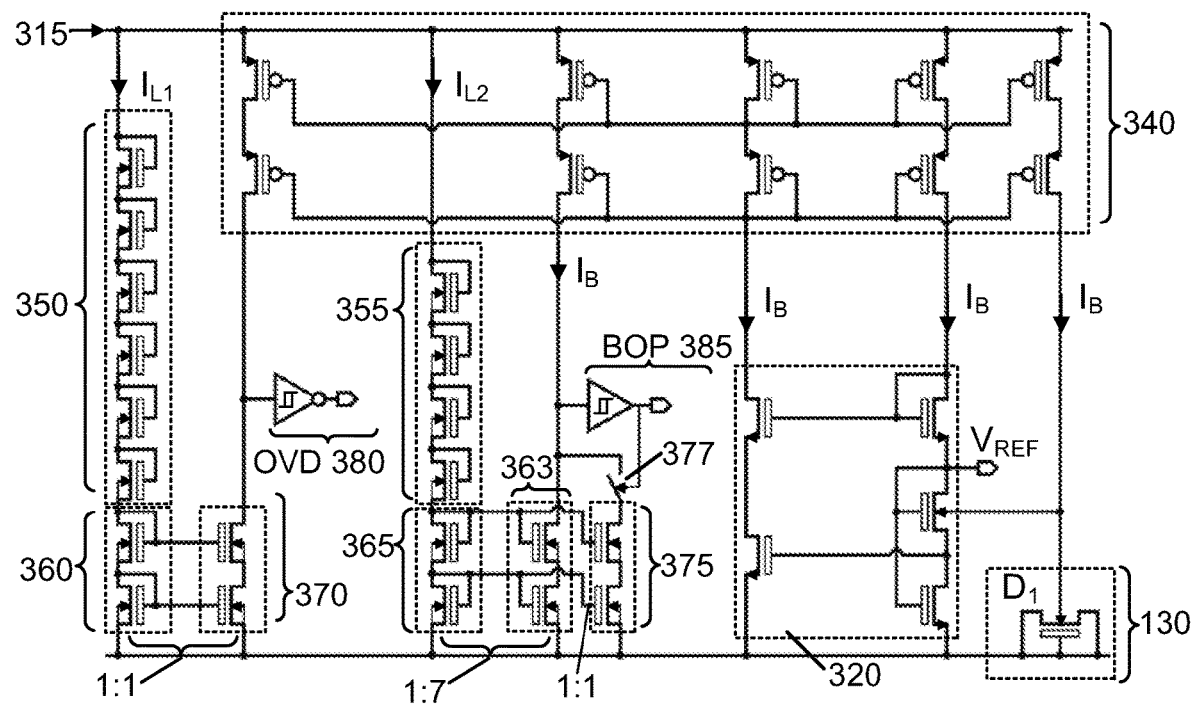
FIG. 3 is a circuit diagram illustrating a particular implementation of a system, which may perform a voltage comparison function similar to those described in reference to FIGS. 1-2, as well as performing additional functions, according to an embodiment.

FIG. 3 is a circuit diagram 300 illustrating an embodiment of a system, which may perform voltage comparison functions similar to those described in FIGS. 1-2, as well as performing additional functions. In a manner similar to that described in relation to FIG. 1 and FIG. 2, a signal from a first signal source may be coupled to signal input 315 and to current generating circuits 340. In one embodiment, device ladder 350 may comprise a number of transistor devices, such as transistors configured as diodes, coupled in a series relation. In a manner similar to that of FIG. 2, device ladder 350 may comprise one or more other types of devices in which, for example, an electric current through the device ladder comprises an exponential relationship with an amplitude of signal input 315, and claimed subject matter is not limited in this respect.

An electric current coupled from signal input 315 and through device ladder 350 may be delivered to current sensor 360. In particular embodiments, similar to that of current sensor 160 of FIG. 2, for example, current sensor 360 of FIG. 3 may comprise an input signal side of a MOSFET current mirror. An input signal side of a MOSFET current mirror may replicate an input current flow, for example, through current copier 370. In one embodiment, current generating circuits 340 may comprise relatively stable sources of electric current, which may flow, for example, to overvoltage detection node 380 (OVD 380) and in the direction of current copier 370. Thus, when current copier 370 permits passage of a relatively large current, based at least in part on a current $I_{L1}$ as sensed via current sensor 360, a signal, such as a voltage, present at overvoltage detection node 380 may comprise a relatively small value. Conversely, when current copier 370 permits passage of a relatively small current, responsive to sensing of a relatively small current via current sensor 360, overvoltage detection node 380 may comprise an increased value.

In one embodiment, when a nominal (e.g., average) current ($I_{L1}$), which may represent nominal operation of a battery, power bus, or energy-harvesting system, flows through device ladder 350 and in the direction of current sensor 360, a replica of current $I_{L1}$ may be permitted to flow through current copier 370 to a signal ground. However, responsive to signal input 315 comprising higher than nominal amplitude, which may indicate the presence of, for example, excess battery voltage, current copier 370 may, in turn, permit an increased amount of electric current to pass from current generating circuits 340 to a signal ground. Accordingly, responsive to a capability for increased current flow by current copier 370, a signal amplitude measured at overvoltage detection node 380 may fall below a threshold value, such as a value based, at least in part, on an output signal from a second signal source 320 (e.g., $V_{REF}$). In certain embodiments, falling of a signal amplitude measured at overvoltage detection node 380 may indicate an overvoltage condition of a battery, power bus, energy harvesting system, or the like.

In FIG. 3, overvoltage detection node 380 may perform a hysteresis function so as to reduce, or to preclude entirely, variations in an output signal of overvoltage detection node 380 responsive to relatively small variations in amplitude of signal input 315 near a triggering threshold of detector 380. Thus, if the voltage comparison apparatus of FIG. 3 is instrumented to respond to an overvoltage condition when signal input 315 comprises a value of, for example, 9.0 V, hysteresis of overvoltage detection node 380 may be designed to provide a first output signal responsive to signal input 315 rising so as to comprise an amplitude of about 9.0 V. Hysteresis of overvoltage detection node 380 may additionally be designed to provide a second output signal responsive to signal input 315 falling to below, for example, 8.75 V. However, it should be noted that this is but one example of numerous possible examples, and claimed subject matter is not intended to be limited in this respect.

The circuit diagram 300 may additionally include brownout detector 385 (BOP 385), which may provide a signal output responsive to $I_{L2}$ falling below, for example, $V_{REF}$. In such an embodiment, when signal input 315 comprises a nominal value, or a range of nominal values, current $I_{L2}$ may flow through device ladder 355. Similar to device ladder 350, device ladder 355 may comprise a number of transistor devices, such as transistors configured as diodes, coupled to one another in a series relation. Device ladder 355 may comprise one or more other types of devices, wherein current through the device ladder comprises an exponential relationship with an amplitude of signal input 315.

An electric current coupled from signal input 315 and through device ladder 355 may be delivered to current sensor 365. In particular embodiments, similar to that of current sensor 160 of FIG. 2, current sensor 365 may comprise an input signal side of a MOSFET current mirror. An input side of a MOSFET current mirror may replicate an input current flow through current copier 363. It should be noted, however, that in accordance with FIG. 3, current sensor 365 may be utilized to permit a current flow equal to about seven times, for example, $I_{L2}$. In a manner similar to that of current copier 170, such replication may provide a capability to perform a current comparison function utilizing only a fraction (e.g., 1/7) of the current through device ladder 355.

In one embodiment, when signal input 315 comprises a relatively low amplitude, which may indicate a brownout, or loss of voltage entirely, current copier 363 may permit only a relatively small amount of current to be accepted by current copier 363 under such conditions, a signal amplitude measured at brownout detector 385 may increase so as to approach, or exceed, a threshold value, such as a value based, at least in part, on an output signal of second signal source 320 (e.g., $V_{REF}$). It should be noted that in particular embodiments, brownout detector 385 may operate to control switch 377 responsive to a signal amplitude of brownout detector 385 attaining a particular value to indicate that a brownout, or voltage dropout, has occurred. In a manner similar to that of overvoltage detection node 380, brownout detector 385 may perform hysteresis functions so as to reduce, or to preclude entirely, variations in an output signal of brownout detector 385 responsive to a relatively small variations in amplitude of signal 315 near a triggering threshold of detector 385. Thus, if the voltage comparison apparatus of FIG. 3 is instrumented to respond to a brownout condition when signal input 315 comprises a value of, for example, 5.0 V, hysteresis of brownout detector 385 may be designed to provide a first output signal responsive to signal 315 dropping so as to comprise an amplitude of 5.0 V. Hysteresis of brownout detector 385 may additionally be designed to provide a second output signal, responsive to signal input 315 rising to above, for example 5.25 V. However, it should be noted that this is but one example of numerous possible examples, and claimed subject matter is not intended to be limited in this respect. In certain embodiments, brownout detector 385 may be utilized to indicate a need for a memory re-initialization process, which may include resetting, for example, memory circuits comprising contents that may be degraded by an abrupt and unplanned interruption of battery power.

Figure 4:
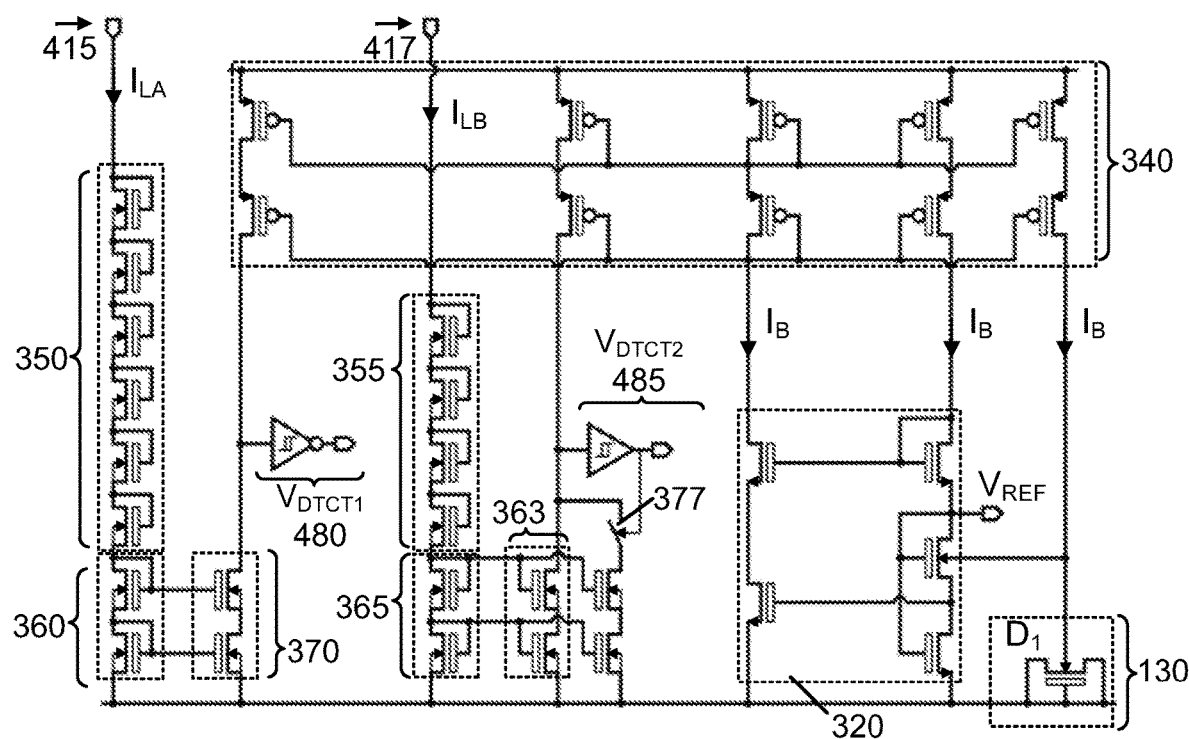
FIG. 4 is a circuit diagram illustrating a particular implementation of a system, which may perform a voltage comparison function similar to that described in reference to FIG. 3, as well as performing additional functions, according to an embodiment.

FIG. 4 is a circuit diagram 400 illustrating a particular implementation of a system, which may perform a voltage comparison function similar to that described in FIG. 3, as well as performing additional functions. The circuit diagram 400 comprises a number of elements similar to the circuit diagram 300, such as, for example, second signal source 320, device ladders 350 and 355, current sensors 360 and 365, current copiers 370 and 375, overvoltage detection node 380, brownout detector 385, signal bias 130, as well as current generating circuits 340. However, in circuit diagram 400, signal input 415 may be utilized to provide a signal from a first battery, first power bus, first energy harvesting system. Signal input 417 may be utilized to provide a signal from a second battery, second power bus, or second energy harvesting system. Accordingly, responsive to sensing of current $I_{LA}$, which may be induced to flow through device ladder 350 in response to a signal present at signal input 415, current summing node 480 ($V_{DTCT1}$) may provide an indication of a condition of a first signal source. Similarly, responsive to sensing of current $I_{LB}$, which may be induced to flow through device ladder 355 in response to a signal present at signal input 417, current summing node 485 ($V_{DTCT2}$) may provide an indication of the condition of a second signal source. It should be noted that the architecture of FIG. 4 may be extended to comprise additional signal inputs other than signal input 415 and signal input 417.

Figure 5:
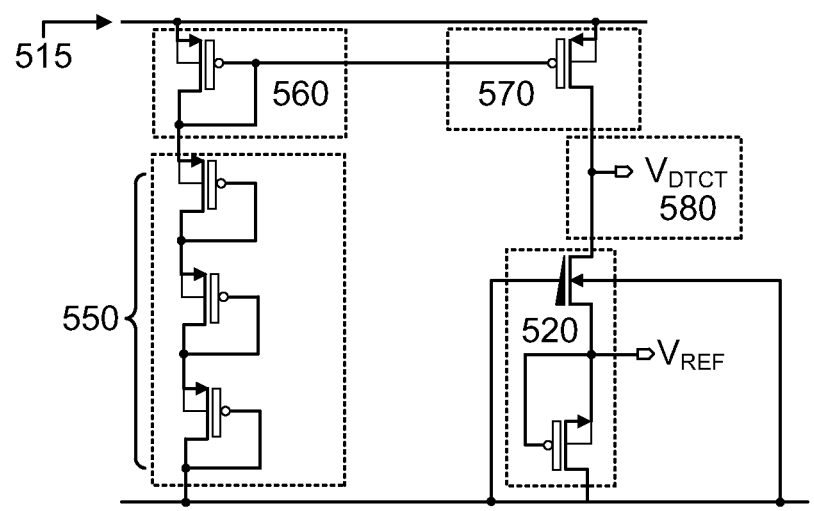
FIG. 5 is a circuit diagram illustrating a particular implementation of a system, which may perform a voltage comparison function similar to that described in reference to FIG. 1, as well as performing additional functions, according to an embodiment.

FIG. 5 is a circuit diagram 500 illustrating a particular implementation of a system, which may perform a voltage comparison function similar to that described in reference to FIG. 1, according to an embodiment. In circuit diagram 500, signal input 115 comprises a voltage signal from a chemical storage element, such as a battery. Device ladder 550 may comprise a number of transistor devices, such as transistors configured as diodes, coupled in a series relation. In other embodiments, device ladder 550 may comprise one or more other types of devices in which an electric current conducted through the device ladder may be exponentially related to an applied voltage. Transistor 560 may receive signal input 515, wherein current conducted through transistor 560 may be copied by current copier transistor 570. Accordingly, a copy of an electric current conducted through transistor 560 may be conducted through transistor 520, as shown in FIG. 5. In particular embodiments, transistor 520 may comprise a native transistor, which may be defined as a transistor having negligible doping (or, perhaps, no doping whatsoever) in a bulk region of the device, so as to provide operational parameters between those of an N-type MOSFET and P-type MOSFET. Thus, at least in certain embodiments, transistor 520 may comprise a threshold that approximates 0.0 V. Accordingly, a current conducting through transistor 520 may approximate, for example, current conducted through transistor 560 and through device ladder 550.

It may be appreciated that the circuit indicated in circuit diagram 500 may operate similar or identical to the circuit described in reference to FIG. 1. However, it may also be appreciated that such similar or identical operation may occur without a current generating circuit, such as current generating circuit 140 of FIG. 1. In circuit diagram 500, voltage detection node 580 ($V_{DTCT}$) may be situated between transistor 520, which may operate similar to that of second signal source 120 of FIG. 1. In the circuit diagram of FIG. 5 transistor 520 and current copier 570 may utilize P-type MOSFET transistors, rather than N-type MOSFET transistors, for example, to achieve operation similar to that of previously described embodiments.

Figure 6:
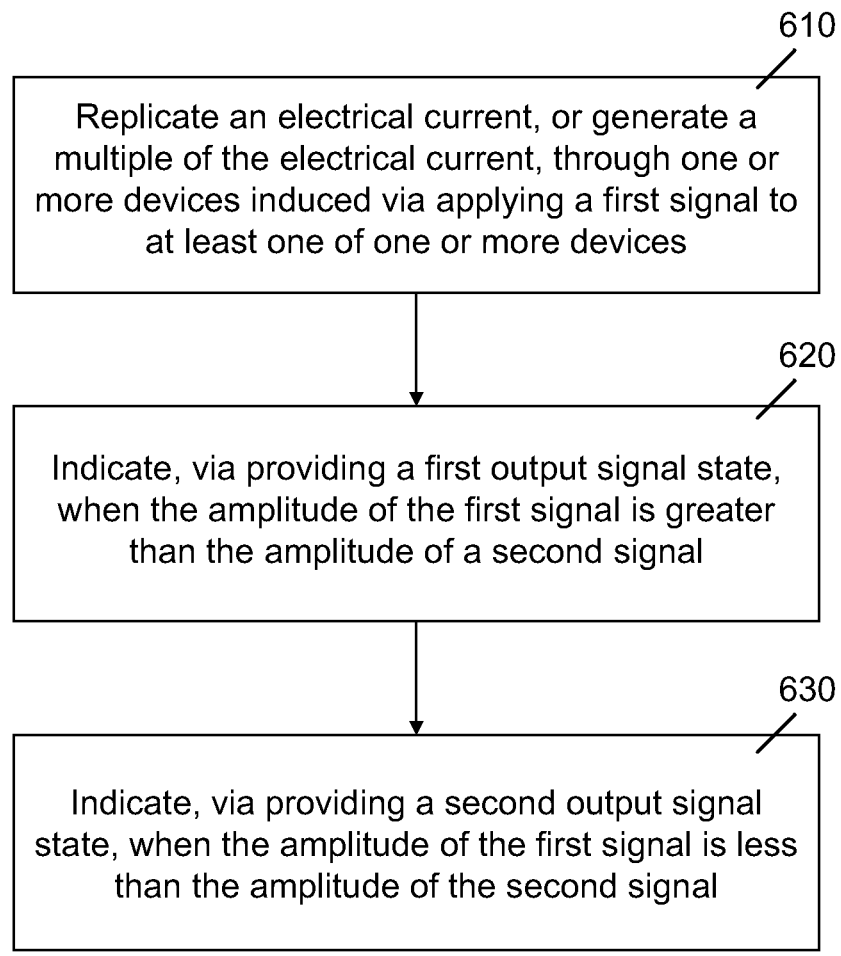
FIG. 6 is a flow chart for a method for performing comparison of a voltage signal to a reference, in accordance with various embodiments described herein.

FIG. 6 is a flow chart for a method for performing comparison of a voltage signal to a reference, in accordance with various embodiments described herein. FIG. 6 may include blocks in addition to those shown and described, fewer blocks or blocks occurring in an order different than may be identified, or any combination thereof. Method 600 may begin at block 610, which may comprise replicating an electric current, or generating a multiple of the electric current, through one or more devices. The electric current may be induced via applying a first signal to at least one of one or more devices.

Replication of an electric current may include utilizing a current copier, such as current copier 170 of FIG. 1. A current copier may replicate an electric current based, at least in part, on an output signal from a current sensor, which may operate to sense an electric current induced by way of coupling a first signal source, such as first signal source 110, to a signal input, such as signal input 115. In one embodiment, by way of coupling a first signal source to a signal input, the electric current may be induced to flow through a device ladder, such as device ladder 150 of FIG. 1. In another embodiment, rather than replicating an electric current induced to flow through a device ladder, such as device ladder 150 of FIG. 1, a current regulator may generate a multiple of an electric current induced to flow through a device ladder.

Method 600 may continue at block 620, which may comprise indicating, via a first output signal state, when the amplitude of the first signal is greater than the amplitude of a second signal. In one embodiment, indicating an output signal state may comprise detecting, for example, that a current summing node, such as current summing node 180, comprises a detected voltage ($V_{DTCT}$) that is greater than an output of a second signal source, such as second signal source 120 of FIG. 1.

Method 600 may continue at block 630, which may comprise indicating, via a second signal output state, when the amplitude of the first signal is greater than the amplitude of a second signal. In one embodiment, indicating an output signal state may comprise detecting, for example, that an output signal of a current summing node, such as current summing node 180, comprises a detected voltage ($C_{SUM}$) that is less than an output of a second signal source, such as second signal source 120 of FIG. 1

Method 600 may be associated with the operations, characteristics, and/or results described for the embodiments 100, 200, 300, 400 and 500 of FIGS. 1-4, respectively. For example, method 600 may be performed by the MOSFET-based arrangement of circuit elements shown in FIG. 2, in which self-cascoded transistors $M_1$, $M_2$, and $M_3$ may be constructed via a single fabrication process, such as a thick-oxide process. In this context, a thick-oxide process may bring about a gate thickness that varies from one another by an amount equal to about + or −20.0% from a nominal value. However, in some embodiments, a thick-oxide process may bring about variances in gate thicknesses of different percentages, such as + or −5.0%, for example, or + or −15.0%, for example. Additionally, transistor $M_2$, may be body biased via a body-biased transistor configured for operation as a diode. In particular embodiments, the arrangement of transistor $D_1$ to form signal bias 130 may simplify computation of thermal characteristics of the self-cascode reference that forms second signal source 120.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. An apparatus to compare an amplitude of a first signal with an amplitude of a second signal, comprising:
   one or more current-mirroring circuits to substantially replicate an electric current, or to generate a multiple of the electric current, through one or more devices induced via applying the first signal to at least one of the one or more devices; and
   an output signal node, connected to at least one of the one or more current-mirroring circuits, to provide a first signal level when the amplitude of the first signal is greater than the amplitude of the second signal and to provide a second signal level when the amplitude of the first signal is less than the amplitude of the second signal, wherein the amplitude of the second signal is generated via an electric current flow through one or more body-biased transistors.

2. The apparatus of claim 1, wherein the one or more devices comprise transistors configured as diodes.

3. The apparatus of claim 2, wherein the transistors configured as diodes are arranged in a series relation.

4. The apparatus of claim 1, wherein the amplitude of the first signal corresponds to a voltage signal obtained from an external chemical storage element, an external power bus, or a combination thereof.

5. The apparatus of claim 1, wherein the one or more body-biased transistors operate in a sub-threshold state.

6. The apparatus of claim 1, wherein the one or more current-mirroring circuits operate to consume less than about 500.0 pW.

7. The apparatus of claim 1, wherein the output signal node provides a voltage that is based, at least in part, on a replica of an electric current utilized to generate the second signal.

8. The apparatus of claim 1, further comprising at least one device, coupled to the output signal node, to implement one or more hysteresis functions.

9. An apparatus to compare an amplitude of a first signal with an amplitude of a second signal, comprising:
one or more current-mirroring circuits to substantially replicate an electric current, or to generate a multiple of the electric current, through one or more devices induced via applying the first signal to at least one of the one or more devices, wherein the one or more current-mirroring circuits comprise one or more transistors formed via a deposition process that brings about a gate thickness of the one or more transistors that varies between about + or −20.0% of a nominal value; and
an output signal node, connected to at least one of the one or more current-mirroring circuits, to provide a first signal level when the amplitude of the first signal is greater than the amplitude of the second signal and to provide a second signal level when the amplitude of the first signal is less than the amplitude of the second signal.

10. A method, comprising:
replicating an electric current, or generating a multiple of the electric current, through one or more devices induced via applying a first signal to at least one of the one or more devices;
generating a second signal via body-biasing one or more transistors;
indicating, via providing a first output signal state, when an amplitude of the first signal is greater than an amplitude of the second signal; and
indicating, via providing a second output signal state, when the amplitude of the first signal is less than the amplitude of the second signal.

11. The method of claim 10, wherein replicating of the electric current, or generating the multiple of the electric current, is performed via a current-mirroring circuit.

12. The method of claim 10, further comprising placing the one or more body-biased transistors into a sub-threshold state.

13. The method of claim 10, further comprising replicating an electric current utilized to generate the second signal in a conductor during the indicating of the amplitude of the first signal being greater than the amplitude of the second signal.

14. An apparatus, comprising:
a current generator to generate a first electric current based, at least in part, on a second electric current through one or more transistor devices operating in a sub-threshold state; and
a voltage detector, coupled to the current generator, to provide an output signal having a first level when the current through a plurality of transistor devices is relatively high, and to provide an output signal having a second level when the current through the plurality of transistor devices is relatively low.

15. The apparatus of claim 14, further comprising a voltage reference having one or more transistors operating in a sub-threshold state to determine an electric current to flow through the current generator.

16. The apparatus of claim 14, wherein the second electric current is based, at least in part, on a voltage obtained from an external chemical storage element, an external power bus or an external energy harvester, or any combination thereof.

17. The apparatus of claim 14, wherein the apparatus operates to consume less than about 500.0 pW.

18. The apparatus of claim 14, wherein the one or more transistor devices comprise one or more diode-configured transistor devices.

* * * * *